(12) United States Patent
Honda

(10) Patent No.: US 11,779,989 B2
(45) Date of Patent: Oct. 10, 2023

(54) COATED METAL MOLD AND METHOD FOR MANUFACTURING SAME

(71) Applicant: PROTERIAL, LTD., Tokyo (JP)

(72) Inventor: Fumiaki Honda, Yasugi (JP)

(73) Assignee: PROTERIAL, LTD., Tokyo (JP)

( * ) Notice: Subject to any disclaimer, the term of this patent is extended or adjusted under 35 U.S.C. 154(b) by 226 days.

(21) Appl. No.: 15/567,970

(22) PCT Filed: Apr. 22, 2016

(86) PCT No.: PCT/JP2016/062828
§ 371 (c)(1),
(2) Date: Oct. 20, 2017

(87) PCT Pub. No.: WO2016/171273
PCT Pub. Date: Oct. 27, 2016

(65) Prior Publication Data
US 2018/0141102 A1   May 24, 2018

(30) Foreign Application Priority Data

Apr. 23, 2015   (JP) .................................. 2015-088365

(51) Int. Cl.
*B21D 37/01*   (2006.01)
*B21J 13/02*   (2006.01)
(Continued)

(52) U.S. Cl.
CPC ............... *B21D 37/01* (2013.01); *B21J 13/02* (2013.01); *C23C 14/022* (2013.01);
(Continued)

(58) Field of Classification Search
CPC .......... B21D 37/01; B21D 37/20; B21C 3/02; B21C 3/025; B21C 25/02; B21C 25/025; B21C 25/10; B21J 13/02
(Continued)

(56) References Cited

U.S. PATENT DOCUMENTS

2004/0169313 A1 * 9/2004 Ferrachat .......... B29D 11/00432
264/226
2008/0076684 A1 * 3/2008 Nanbu .................... F16C 33/04
508/109
(Continued)

FOREIGN PATENT DOCUMENTS

JP   2005-042146 A   2/2005
JP   2007-31797 A   2/2007
(Continued)

OTHER PUBLICATIONS

Suszko et al., Preferentially Oriented Vanadium Nitride Films Deposited by Magnetron Sputtering, Publication 2011, Total 3 Pages. (Year: 2011).*

(Continued)

*Primary Examiner* — Katrina M Stransky
*Assistant Examiner* — P Derek Pressley
(74) *Attorney, Agent, or Firm* — SOLARIS Intellectual Property Group, PLLC

(57) ABSTRACT

The purpose of the present invention is to provide a coated metal mold having superior durability and adhesion resistance over a usage range from cold to warm/hot; and a method for manufacturing the coated metal mold. The coated metal mold is characterized by having a hard coating on a surface, wherein the hard coating includes an A layer formed from a nitride and having a film thickness not smaller than 5 μm, and a B layer formed of a diamond-like carbon coating, the B layer is disposed closer to the outer surface side than the A layer, the surface of the B layer has an arithmetic mean roughness Ra≤0.2 μm, a maximum height Rz≤2.0 μm, and a skewness Rsk<0.

4 Claims, 4 Drawing Sheets

1μm

(51) Int. Cl.

| | |
|---|---|
| *C23C 14/06* | (2006.01) |
| *C23C 14/58* | (2006.01) |
| *C23C 28/00* | (2006.01) |
| *C23C 28/04* | (2006.01) |
| *C23C 14/32* | (2006.01) |
| *C23C 14/02* | (2006.01) |
| *C23C 14/35* | (2006.01) |
| *C23C 16/50* | (2006.01) |

(52) U.S. Cl.
CPC ........ *C23C 14/028* (2013.01); *C23C 14/0605* (2013.01); *C23C 14/0611* (2013.01); *C23C 14/0641* (2013.01); *C23C 14/325* (2013.01); *C23C 14/35* (2013.01); *C23C 14/588* (2013.01); *C23C 16/50* (2013.01); *C23C 28/04* (2013.01); *C23C 28/046* (2013.01); *C23C 28/42* (2013.01); *C23C 28/44* (2013.01)

(58) Field of Classification Search
USPC ....................................................... 76/107.1
See application file for complete search history.

(56) References Cited

U.S. PATENT DOCUMENTS

| | | | | |
|---|---|---|---|---|
| 2013/0241004 | A1* | 9/2013 | Yin | ................ H01L 21/823807 257/E27.061 |
| 2014/0013914 | A1* | 1/2014 | Senbokuya | ......... C23C 14/0641 83/651 |
| 2015/0004362 | A1* | 1/2015 | Krishna | ................ C23C 28/046 428/141 |

FOREIGN PATENT DOCUMENTS

| | | | |
|---|---|---|---|
| JP | 2008-214154 A | | 9/2008 |
| JP | 2010-284710 A | | 12/2010 |
| JP | 2010284710 A | * | 12/2010 |
| JP | 2011-183545 A | | 9/2011 |
| JP | 2011183545 A | * | 9/2011 |
| JP | 2011183545 A | * | 9/2011 |
| JP | 2012-115869 A | | 6/2012 |
| JP | 2012-232344 A | | 11/2012 |
| JP | 2013151707 A | * | 8/2013 |
| JP | 2013249491 A | * | 12/2013 |
| JP | 2014-196680 A | | 10/2014 |
| WO | 2013/047548 A1 | | 4/2013 |
| WO | 2014/147805 A1 | | 9/2014 |
| WO | 2016/042945 A1 | | 3/2016 |

OTHER PUBLICATIONS

Machine Translation of WO-2014147805 A1, Shinichi et al., Publication Year 2014, Total Pages 7. (Year: 2020).*
English language translation of the following: Office action dated Dec. 21, 2018 from the SIPO in a Chinese patent application No. 201680023253.8 corresponding to the instant patent application. This office action translation is submitted now in order to supplement the understanding of the cited reference which is being disclosed in the instant Information Disclosure Statement.
English language translation of the following: Office action dated Aug. 14, 2018 from the JPO in a Japanese patent application No. 2017-514223 corresponding to the instant patent application. This office action translation is submitted now in order to supplement the understanding of the cited reference which is being disclosed in the instant Information Disclosure Statement.
Partial English language translation of the following: Office action dated Sep. 10, 2019 from the SIPO in a Chinese patent application No. 201680023253.8 corresponding to the instant patent application. This office action translation is submitted now in order to supplement the understanding of the cited reference which is being disclosed in the instant Information Disclosure Statement.
Office Action dated Feb. 25, 2020, issued by the KIPO in corresponding Korean Patent Application No. 10-2017-7030103.

* cited by examiner

1μm

1μm

FIG.6
No. 1 — Opposite material: Zn — Opposite material: Al
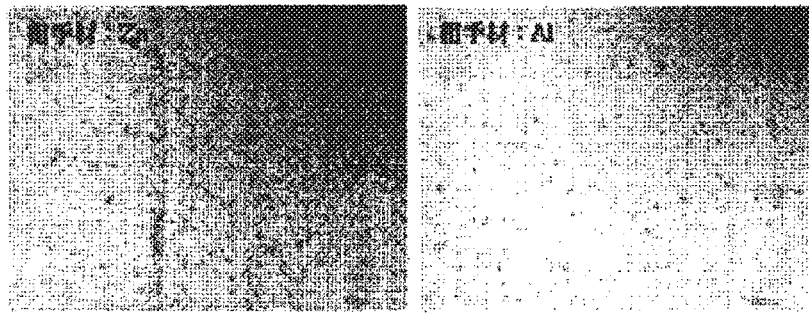
No. 11 — Opposite material: Zn — Opposite material: Al
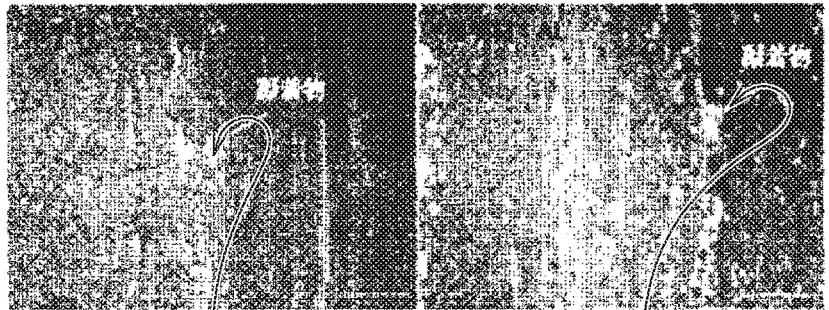
Adhered matter — Adhered matter
No. 12 — Opposite material: Zn — Opposite material: Al
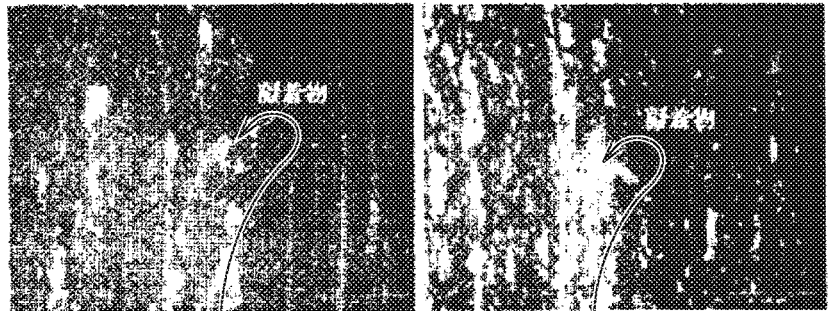
Adhered matter — Adhered matter
No. 14 — Opposite material: Zn — Opposite material: Al
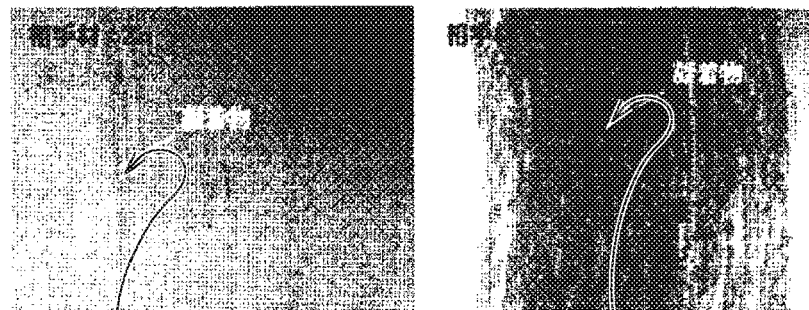
Adhered matter — Adhered matter

COATED METAL MOLD AND METHOD FOR MANUFACTURING SAME

This is the U.S. National Stage of International Application No. PCT/JP2016/062828, filed on Apr. 22, 2016, which is hereby incorporated by reference in its entirety. Priority is claimed to Japanese Application No. 2015-088365, filed on Apr. 23, 2015, which is also hereby incorporated by reference in its entirety.

BACKGROUND OF THE INVENTION

Technical Field

The present invention relates to a coated metal mold covered with a hard coating, which can be applied to, for example, molds for press working or for forging, and a method for manufacturing the coated metal mold.

Background Art

Conventionally, metal molds prepared by using, as the base material, steel represented by tool steel such as cold die steel, hot die steel, or high-speed steel, a hard metal, or the like have been used for plastic working such as forging or press working. Methods for the above plastic working include cold working in which working is conducted at near-room temperature, and warm working or hot working in which working is conducted by heating a workpiece material to 400° C. or higher. In plastic working using a metal mold for press working or for forging, when the working plane of the metal mold and a workpiece material slide against one another, abrasion or galling may occur on the working plane of the metal mold, so that wear on the working plane of the metal mold is likely to occur. Therefore, enhancement of mold life is required.

In recent years, for the enhancement of mold life, coated metal molds in which the working plane is covered with a hard coating by physical vapor deposition (hereinafter, referred to as PVD method) have been applied. Among various means for forming a coating, physical vapor deposition permits coating at a temperature lower than a tempering temperature for steel. Therefore, in physical vapor deposition, softening of the metal mold due to coating is slight, and deformation or dimensional variation of the metal mold is less likely to occur.

For example, Patent Document 1 shows the use of a nitride of AlCrSi, which is a kind of film having excellent heat resistance and wear resistance. Further, Patent Document 2 shows a coating film structure provided with a laminated film, in which a nitride of V having excellent sliding characteristic and a nitride of AlCrSi are alternately layered, and whose surface roughness is controlled to be within a definite range.

PRIOR ART DOCUMENTS

Patent Document 1: Japanese Patent Application Laid-Open (JP-A) No. 2005-042146
Patent Document 2: JP-A No. 2011-183545

SUMMARY OF INVENTION

Technical Problem

In recent years, concerning the steel sheets to be used in the automotive body, the number of high tensile strength steel sheets has been increasing. For molding thereof, a hot stamping method may be applied, in which a workpiece material is heated and then subjected to press molding and hardening at the same time. Particularly, in the case of processing a plated steel sheet plated with aluminum or zinc by the hot stamping method, adhesion may occur on the metal mold surface and, as a result, the mold life may arrive at the end in the early stage.

According to the study of the inventors of the present invention, it is confirmed that, in a case in which a plated steel sheet is processed under a use environment involving a heavy load, or by the hot stamping method or the like, there is room for improvement in conventional coated metal molds from the standpoints of mold life and adhesion resistance. An object of the invention is to provide a coated metal mold excellent in wear resistance, heat resistance, and adhesion resistance, and a method for manufacturing the coated metal mold.

Solution to Problem

An embodiment of the invention is a coated metal mold having a hard coating on the surface, the hard coating including an A layer formed from a nitride and having a film thickness of 5 μm or more, and a B layer formed from a diamond-like carbon coating, wherein the B layer is disposed closer to the outer surface side than the A layer, and the surface of the B layer has an arithmetic mean roughness Ra≤0.2 μm, a maximum height Rz≤2.0 μm, and a skewness Rsk<0. It is preferable that the A layer is a laminated film, in which a nitride containing chromium and a nitride containing vanadium are alternately layered. It is preferable that the A layer has a film thickness of 8 μm or more.

Another embodiment of the invention is a method for manufacturing a coated metal mold having a hard coating coated on the surface, the method including: a step of applying an A layer formed from a nitride and having a film thickness of 5 μm or more; a surface polishing step of polishing the surface of the A layer so that the A layer has a surface roughness of Ra≤0.2 Rz≤2.0 μm, and Rsk<0; and after the step of polishing the surface of the A layer, a step of applying a B layer formed from a diamond-like carbon coating; wherein the surface of the B layer satisfies an arithmetic mean roughness Ra≤0.2 μm, a maximum height Rz≤2.0 μm, and a skewness Rsk<0. It is preferable that the A layer is coated to have a thickness of 8 μm or more.

Advantageous Effects of Invention

According to the invention, a coated metal mold which has excellent durability over a usage range from cold to warm/hot and can enhance the mold life may be provided.

BRIEF DESCRIPTION OF DRAWINGS

FIG. 6 includes magnified photographs of the film surfaces, which show the form of damage in the films due to the ball-on-disk test in the examples of the invention and the comparative examples.

DESCRIPTION OF EMBODIMENTS

Figure 1:
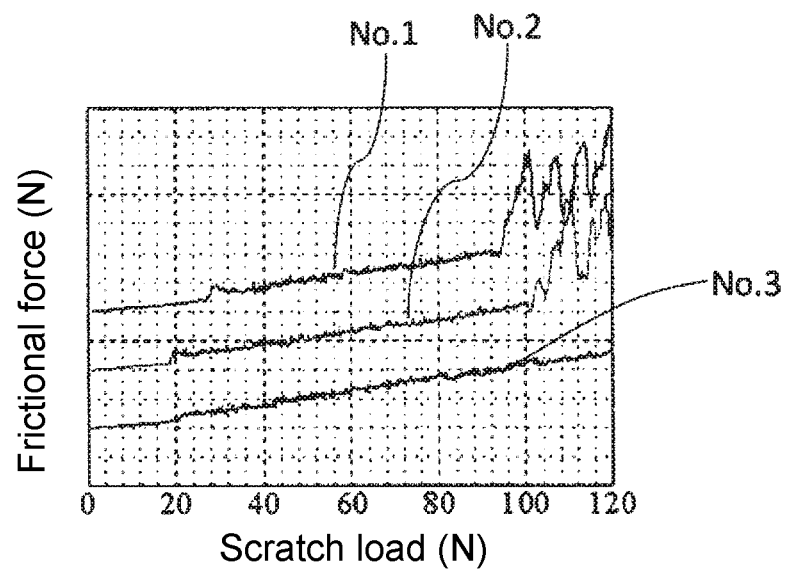
FIG. 1 shows the results of a scratch test in the examples of the invention.

For the metal molds used in plastic working such as forging or press working, coated metal molds having a hard coating formed on the surface are used. In the coated metal molds used for these purposes, the force to be applied to the surface of the hard coating is large. Therefore, when the coating film is thin, the film strength becomes insufficient and the coating film is likely to be damaged. Particularly, under a high load environment, since a large force is applied to the interface between the coating film and the metal mold, film peeling or film damage easily occurs due to the difference in the quantity of elastic deformation between the coating film and the metal mold. Accordingly, the influence of the film thickness of the hard coating on the mold life becomes extremely great. In a case in which the sliding characteristic of the hard coating itself is insufficient, galling may occur and the mold life tends to arrive at the end in the early stage.

In order to exhibit excellent durability under a high load environment, the inventors of the invention have found that, as to the hard coating, a coating configuration is effective, in which a layer (B layer) formed from a diamond-like carbon (hereinafter, also described as DLC) coating is provided, as the upper layer (the "upper layer" means a layer on the upper side, when the outer surface side of the coated metal mold, on which a hard coating is formed, is designated as the upper side and the inner side of the coated metal mold is designated as the lower side), on a layer (A layer) formed from a nitride and having a large film thickness. Further, the inventors of the invention have found that it is important to polish the surface of the A layer which faces the B layer. Hereinafter, the invention is described in detail. In the present specification, the term "durability" is the general term for wear resistance, heat resistance, and adhesion resistance, and "excellent durability" means that the three kinds of resistances described above are excellent.

The coating film formed from a nitride is a kind of film having excellent heat resistance and wear resistance, and also tends to have excellent adhesion with respect to the steel of a metal mold, and the like. Therefore, by forming a coating film of a nitride to be thicker, the durability of the coated metal mold can be further enhanced. In the invention, in order to exhibit excellent durability under a use environment involving a high load, an A layer formed from a nitride and having a large film thickness, being in the range of 5 μm or more, is provided. However, the A layer formed from a nitride tends to be insufficient in sliding characteristic, and galling or adhesion may occur in the early stage. Accordingly, in order to impart excellent sliding characteristic to the coated metal mold, a B layer of a diamond-like carbon coating, which is a kind of film having excellent sliding characteristic, is disposed as the upper layer, on the A layer. By disposing a diamond-like carbon coating, which is a kind of film having excellent sliding characteristic, on the A layer, galling or adhesion in the early stage tends to be suppressed, and adhesion resistance can be enhanced.

Here, in order to sufficiently exhibit the effect of the B layer, it is important that the surface of the A layer which faces the B layer is polished, and then the B layer is provided. In the invention, since the A layer is controlled to have a large film thickness, the A layer easily collects droplets or film defects. Accordingly, when the A layer is left as it is after formation, the surface of the A layer gets rough. Therefore, when a B layer, which is a diamond-like carbon coating including an amorphous substance as the main body, is disposed directly on the A layer having a rough surface as it is, irregularities are generated also on the surface of the B layer so as to follow the rough surface (irregularities) of the A layer, and the surface state of the B layer is deteriorated. Since the irregularities of the surface of the B layer are caused by the surface roughness of the A layer, it is difficult to improve the surface roughness (especially, the skewness Rsk described below) of the B layer, by polishing only the B layer. Moreover, it is difficult to sufficiently ensure the adhesion between the A layer and the B layer, and peeling tends to occur easily. Accordingly, by polishing the surface of the A layer to remove the surface defects such as droplets or the like and then disposing the B layer, the adhesion between the A layer and the B layer is enhanced, as well as the surface roughness of the B layer can be made smooth.

By subjecting the A layer to polishing as described above, the surface of the B layer in the invention can be set such that the arithmetic mean roughness Ra (in accordance with JIS-B-0601-2001) is 0.2 μm or less, the maximum height Rz (in accordance with JIS-B-0601-2001) is 2.0 μm or less, and the skewness Rsk (in accordance with JIS-B-0601-2001) is less than 0.

When droplets, film defects, impurities, or the like are incorporated in the surface of the hard coating, the metal mold is not suited for use as a metal mold. Further, under a sliding environment, the convex portion of the film surface becomes a starting point and attacks the workpiece material, and abrasion powder is generated, whereby film peeling or abrasion occurs. Accordingly, it is important to control the skewness Rsk in order to keep the frequency of convex portions under control, in addition to the arithmetic mean roughness Ra and the maximum height Rz, which are general indices of surface roughnesses.

The skewness Rsk is a parameter that indicates the symmetric property with respect to the center line of an amplitude distribution curve. For example, in the case of a film surface having a lot of concave portions on the surface, the skewness Rsk represents less than 0, and in the case of a film surface having a lot of convex portions, the skewness Rsk represents 0 or more. It is possible to control the frequencies of convex portions and concave portions. In the invention, it is preferable that the film surface has a few convex portions, and it is good that the skewness Rsk is less than 0.

By polishing using an abrasive paper, or by polishing while spraying media including a resin and diamond particles, the surface roughnesses as to the arithmetic mean roughness Ra and the maximum height Rz can be reduced, but it is not easy to certainly decrease the number of convex portions and it is difficult to control the skewness Rsk of a coating film to be less than 0. Meanwhile, when carrying out buff polishing using diamond paste, a smooth surface with decreased number of convex portions can be easily obtained, which is preferable for controlling the skewness Rsk to be less than 0.

The A layer is formed from a nitride, and may be a single layer or a multilayer, as far as the total film thickness is 5 μm or more. Further the A layer may be a laminated film, in which nitrides having different compositions are alternately layered.

It is preferable that the film thickness of the A layer after polishing is 8 μm or more. Further, the A layer preferably has a film thickness of 10 μm or more. However, when the film thickness is too thick, there are cases in which film peeling is likely to occur depending on the processing condition. Accordingly, the film thickness of the A layer is preferably 70 μm or less. Further, it is preferably 60 μm or less. Further, it is preferably 50 μm or less. Further, it is preferably 40 μm or less.

It is preferable that the A layer is formed from a nitride containing one kind or two or more kinds of elements selected from the group consisting of metal elements of Group 4a, Group 5a, and Group 6a of the Periodic Table and aluminum (Al), silicon (Si), and boron (B). Since the nitrides containing one or more of these elements have high heat resistance and high wear resistance, the nitrides have excellent durability. Further, it is preferable that the crystal structure of the A layer is a face centered cubic lattice (fcc) structure, which tends to have more excellent durability.

In a harsh use environment, there may be a possibility that the B layer is worn away. Thus, in order to ensure a certain degree of durability also in a state in which the A layer is exposed, it is preferable that the A layer includes a nitride containing chromium (Cr). Specifically, for example, a hard coating of CrN, CrAlN, CrSiN, AlCrSiN, or the like is preferable. These hard coatings are excellent in wear resistance and heat resistance. Further, when the hard coating contains chromium, a uniform and dense oxide film is easily formed on the surface of the metal mold that is being processed, and damages tend to be suppressed. Accordingly, in a metal mold to be used under a high load environment in which frictional heat is generated during sliding, application of a nitride containing chromium is effective and preferable for the enhancement of life of the coated metal mold.

Furthermore, it is also preferable that the A layer includes a nitride containing vanadium (V). Since vanadium is adequately oxidized in an operating temperature range of from 25° C. to 200° C., a compound that mainly includes vanadium forms a thin oxide film on the surface of the metal mold, thereby reducing the affinity with respect to the opposite material (the workpiece material). Therefore, when the A layer contains vanadium nitride excellent in sliding characteristic, the whole hard coating has excellent sliding characteristic, and bonding of the workpiece material onto the surface of the coating film in use of the metal mold can be reduced. In a case in which the workpiece material is an iron-based material, the oxide of vanadium reacts with iron oxide, which is the surface of the workpiece material or the abrasion powder, and as a result, the iron oxide is softened. Therefore, abrasive wear, which proceeds when the abrasion powder enters into the coating film, can be suppressed. Further, the effect of the oxide of vanadium on softening the iron oxide of the workpiece material has a tendency of suppressing the generation of abrasion powder during sliding, and local scratch or galling can be suppressed at the working plane during press molding.

In a case in which the A layer according to the invention is a single layer, it is preferable that the A layer is formed from chromium nitride or vanadium nitride. Here, the chromium nitride includes those containing one kind or two or more kinds of elements selected from the group consisting of metal elements of Group 4a, Group 5a, and Group 6a of the Periodic Table and aluminum (Al), silicon (Si) and boron (B).

In order to effectively obtain the effects of addition of chromium and vanadium as described above, it is preferable that the A layer includes a laminated film, in which a nitride containing chromium and a nitride containing vanadium are alternately layered. By having such a laminated film, excellent wear resistance and heat resistance can be imparted, and at the same time, excellent sliding characteristic can also be imparted to the A layer, which is the main body of the hard coating and is a thick film, and therefore the durability of the coated metal mold can be enhanced further.

The nitride containing chromium is preferably a nitride having a content of chromium of 30% or higher in terms of atomic percent in the metal portion. Further, the nitride containing vanadium is preferably a nitride having a content of vanadium of 60% or higher in terms of atomic percent in the metal portion, more preferably 70% or higher, and still more preferably 80% or higher.

In order to effectively exhibit all the characteristics of the nitride containing chromium excellent in wear resistance and heat resistance and the nitride containing vanadium excellent in sliding characteristic, it is preferable that the thickness of the individual film in the laminated film is 100 nm or less. By controlling the thickness of the individual film in the laminated film, a coated metal mold having the characteristics described above in good balance can be obtained. Further, generation of irregularities on the film sliding surface can be suppressed even under various temperature environments in use and aggressiveness with respect to the workpiece material is low. Thus, damage such as galling that occurs at the time of sliding is suppressed, and the life of the coated metal mold can be improved. The thickness of the individual film is more preferably less than 50 nm, and still more preferably less than 20 nm. Further, it is preferable that the thickness of the individual film is 3 nm or more.

Further, in the invention, in order to exhibit sufficient sliding characteristic even under a harsh use environment, it is preferable that the film thickness of the nitride containing vanadium is larger than the film thickness of the nitride containing chromium. Further, when the film thickness of the nitride containing vanadium is 1.5 times or more larger than the film thickness of the nitride containing chromium, an oxide of vanadium that enhances the sliding characteristic is sufficiently produced, which is thus more preferable. It is more preferably 2.0 times or more.

In an operating temperature range of approximately 300° C. or higher, oxidation of a compound including vanadium as the main body proceeds further. Therefore, an excess amount of oxide is formed and, as a result, there are cases in which wear resistance is deteriorated depending on the use environment. Accordingly, the film thickness of the nitride containing vanadium is preferably equal to or less than 4.0 times as large as the film thickness of the nitride containing chromium.

In a case in which the A layer according to the invention is a multilayer, a laminated film of chromium nitride and vanadium nitride is preferable. It is more preferable that chromium nitride and vanadium nitride are alternately layered. The chromium nitride may include one kind or two or more kinds of elements selected from the group consisting of metal elements of Group 4a, Group 5a, and Group 6a of the Periodic Table and aluminum (Al), silicon (Si) and boron (B).

It is preferable that the B layer is a diamond-like carbon coating containing carbon having a bond between carbon atoms, such as an $sp^2$ bond or an $sp^3$ bond, and/or free-carbon that does not have a bond between carbon atoms. In order to impart higher sliding characteristic, it is preferable that the B layer is a diamond-like carbon coating having the content of $sp^2$ bonds higher than the content of $sp^3$ bonds. The B layer may contain other elements, if necessary, as far as carbon atoms are contained at the highest content among the elements constituting the B layer.

It is preferable that the B layer contains a metal (including semimetal) element, in order to impart characteristics such as wear resistance or heat resistance. It is enough that the metal (including semimetal) element contained in the B layer is contained in the form of a compound such as a metal, an alloy, a carbide, a nitride, a carbonitride, a carbo-oxonitride, or a carboboride. The content percentage (atomic %) of the metal (including semimetal) element is preferably 2% or higher. Further, it is preferably 5% or higher. However, when the content percentage of the metal (including semimetal) element gets higher, the sliding characteristic tends to be deteriorated. Therefore, in the B layer, the content percentage (atomic %) of the metal (including semimetal) element is preferably 20% or lower. Further, it is preferably 10% or lower.

Further, in order to impart heat resistance, it is preferable that the B layer is a diamond-like carbon coating containing nitrogen. When the diamond-like carbon coating contains nitrogen, more excellent heat resistance can be imparted to the coating film. Preferably, the content percentage (atomic %) of nitrogen is 5% or higher. Further, it is preferably 10% or higher. However, when the content of nitrogen is too high, the sliding characteristic tends to be deteriorated. Therefore, in order to impart excellent heat resistance, the content percentage (atomic %) of nitrogen in the B layer is preferably 20% or lower. Further, it is preferably 15% or lower.

Moreover, it is preferable that the B layer is a diamond-like carbon coating containing hydrogen. When the diamond-like carbon coating contains hydrogen, the film hardness gets lower and more excellent sliding characteristic can be imparted. Preferably, the content percentage (atomic %) of hydrogen is 5% or higher. Further, it is preferably 10% or higher. However, when the content of hydrogen is too high, wear resistance tends to be deteriorated. Therefore, in the B layer, the content percentage (atomic %) of hydrogen is preferably 30% or lower. Further, it is preferably 25% or lower.

The B layer may contain a metal (including semimetal) element, nitrogen, or hydrogen, singly, or may contain them at the same time. For example, the B layer may contain a metal (including semimetal) element, nitrogen, and hydrogen at the same time, may contain only nitrogen and hydrogen, may contain only a metal (including semimetal) element and nitrogen, or may contain only a metal (including semimetal) element and hydrogen.

The B layer may be a single layer or a multilayer. It is possible that the B layer contains noble gas such as Ar, oxygen, or the like.

The film thickness of the B layer is preferably 1 μm or more. Further, it is preferably 2 μm or more. However, when the film thickness is too thick, there are cases in which film peeling is likely to occur depending on the processing condition. Accordingly, the film thickness of the B layer is preferably 15 μm or less. Further, it is preferably 12 μm or less.

The material of the metal mold according to the invention is not particularly defined, and cold die steel, hot die steel, high-speed tool steel, a hard metal, or the like can be used as appropriate. A metal mold that has been previously subjected to a surface hardening treatment utilizing diffusion, such as a nitriding treatment or a carburizing treatment, can also be adopted.

By coating the hard coating according to the invention using a PVD method, it becomes possible to perform a coating treatment at a temperature lower than a tempering temperature for the metal mold material such as cold die steel, hot die steel, or high-speed steel, and dimensional variation of the metal mold can be suppressed. Further, residual compressive stress can be imparted to the hard coating and the mechanical characteristics of the hard coating can also be improved, which is thus preferable.

The A layer is preferably coated in accordance with an arc ion plating method that is excellent in adhesion of the coating film, among the PVD methods. After coating the A layer in accordance with the arc ion plating method, the sample is taken out from the furnace, followed by polishing the surface of the A layer. Thereafter, the B layer is preferably coated in accordance with a sputtering method. By coating the B layer in accordance with a sputtering method, a diamond-like carbon coating which is smoother and has excellent sliding characteristic can be coated. Regarding the coating of the B layer, it is preferable that coating is performed by a sputtering method in which electric power is applied to a graphite target and hydrocarbon gas and nitrogen gas are used as the reaction gas. Particularly, it is preferable to coat by using a non-equilibrium magnetron sputtering method. Further, regarding the coating of the B layer, plasma CVD may also be used. By the use of plasma CVD, more excellent productivity is obtained, which is thus preferable.

The surface of the B layer may be subjected to polishing, in order to obtain a smoother surface state.

For polishing the surface of the A layer, mechanical polishing as described below is preferable.
(1) A method of polishing the surface of the hard coating using an abrasive cloth that holds an abrasive such as diamond paste or the like
(2) A polishing method according to so-called AERO LAP (registered trademark) or the like, in which diamond particles and a water-containing abrasive are used, and the abrasive is let to slide at a high speed on the coating film coated on the metal mold, whereby polishing is performed utilizing the frictional force generated.

Further, in the invention, in addition to the polishing methods described above, polishing may be conducted in accordance with a method using a so-called SMAP (which is a specular surface shot machine manufactured by Kamei Tekkousho Ltd.) or the like, in which polishing is performed while jetting an abrasive having elasticity and tackiness, without using air. After the mechanical polishing, polishing with diamond paste of 3 μm or less may be conducted. According to the above, more preferable smoothening can be realized.

According to the above polishing, the surface roughness of the A layer is made to satisfy an arithmetic mean roughness Ra≤0.2 μm, a maximum height Rz≤2.0 μm, and a skewness Rsk<0. It is preferable that the arithmetic mean roughness Ra is 0.05 μm or less and the maximum height Rz is 1.00 μm or less.

Between the metal mold and the A layer, if necessary, a hard coating of a metal, a carbide, a carbonitride, or a nitride having a composition different from that of the A layer, or the like may be coated, in order to enhance the adhesion between the metal mold and the A layer.

Further, in order to enhance the adhesion between the A layer and the B layer, another coating film having a composition different from that of the A layer may be provided, if necessary, before coating the B layer. In this process, it is preferable to provide a hard coating of a metal, a carbide, a carbonitride, or a nitride having a composition different from that of the A layer, or the like, after polishing the surface of the A layer.

This coating film between the A layer and the B layer is more preferably a film containing metal titanium, in order to further enhance the adhesion.

Furthermore, a hard coating of a metal, a carbide, a carbonitride, a nitride, or the like may be coated on the B layer, if necessary.

The invention is preferably applied to a metal mold for plastic working in an environment where the working plane of the metal mold and the workpiece material violently slide against one another. Particularly, when the invention is applied to a coated metal mold used in warm working or hot working in which the workpiece material is heated to 400° C. or higher, the effect of life improvement is great, which is preferable.

Further, it is preferable to apply the invention to a metal mold for hot stamping, in which the workpiece material is heated and then subjected to press molding and hardening at the same time. Moreover, it is preferable to apply the invention to a metal mold for processing a plated steel sheet plated with aluminum, zinc, or the like.

Example 1

For coating of A layer, an arc ion plating apparatus having a structure in which a metal mold rotates at the center surrounded by plural targets was used. The metal target that constitutes the metal or alloy components of the hard coating was prepared by a powder metallurgy method, and this metal target was mounted on the arc ion plating apparatus. As for the metal mold, a specular surface finished product of a hot die steel SKD 61 was used, and degreasing and cleaning were performed sufficiently, before placing the metal mold in the arc ion plating apparatus. As the initial process in the arc ion plating apparatus, the metal mold was heated to around 450° C. using a heater (not shown in the figure) installed in the chamber, and maintained for 50 minutes. Then, Ar gas was introduced, a bias voltage of from −200 V to −500 V was applied to the metal mold, and a plasma cleaning treatment (Ar ion etching) was conducted for 20 minutes.

Subsequently, a bias voltage of −800 V was applied to the metal mold and, using a metal Ti target, metal ion etching was conducted for about 5 minutes (including a cooling period after the metal ion etching). Hereinafter, the coating conditions for each sample are explained in detail.

<Sample No. 1>

After performing ion etching of the metal mold, nitrogen gas was introduced, a bias voltage of −130 V was applied to the metal mold, and an A layer formed from CrN was coated such that the film thickness was about 6 μm, under the conditions of a mold temperature of 450° C., a reaction gas pressure of 3.0 Pa, and an arc current of 100 A. In the coating step, the rotational frequency of the metal mold was set at 3 rpm.

Thereafter, in order to polish the surface of the CrN to be smooth, the metal mold was taken out from the chamber, and surface polishing was conducted using an AERO LAP machine (AERO LAP YT-300) manufactured by Yamashita Works Co., Ltd. Then, polishing was conducted using diamond paste of 1 μm such that the arithmetic mean roughness Ra was 0.2 μm or less, the maximum height Rz was 2.0 μm or less, and the skewness Rsk was less than 0.

For coating of B layer, a sputtering apparatus was used. A metal Ti target and a graphite C target were mounted on this apparatus. The metal mold that had been covered with the A layer was sufficiently degreased and cleaned, and then was placed in the sputtering apparatus. As the initial process in the sputtering apparatus, the metal mold was heated to around 200° C. using a heater installed in the chamber, and maintained for 50 minutes. Then, Ar gas was introduced, a bias voltage of from −200 V to −500 V was applied to the metal mold, and a plasma cleaning treatment (Ar ion etching) was conducted for 20 minutes.

Then, a bias voltage of −50 V was applied to the metal mold, and Ar gas, hydrocarbon gas, and nitrogen gas were introduced. An intermediate layer (including titanium carbide) formed from metal titanium and carbon was coated, under the condition of a sputtering power of from 0.5 kW to 10 kW. On this layer, a B layer formed from diamond-like carbon and having a film thickness of about 4 μm was coated as the outermost layer. In the coating step, the rotational frequency of the metal mold was set at 3 rpm.

<Samples No. 2 and No. 3>

As the A layer, a coating film having a laminate structure of alternate layers of $Al_{60}Cr_{37}Si_3N$ (at. %) and VN (hereinafter, also described as AlCrSiN/VN) was formed. In sample No. 3, an A layer was coated such that the film thickness was about 9 μm. The conditions for the B layer and the like were the same as those in Sample No. 1.

<Sample No. 11>

CrN was coated as the A layer, and for surface polishing of the A layer, only polishing using an AERO LAP machine (AERO LAP YT-300) manufactured by Yamashita Works Co., Ltd. was carried out. The conditions for forming the B layer and the like were the same as those in Sample No. 1.

<Samples No. 12 μm, and No. 13>

Regarding Sample No. 12, CrN was coated as the A layer, and regarding Sample No. 13, AlCrSiN/VN was coated as the A layer. With respect to the both A layers, surface polishing was not conducted, and the B layer was coated. The conditions for forming the B layer were the same as those in Sample No. 1.

<Samples No. 14, No. 15, and No. 16>

Figure 2:
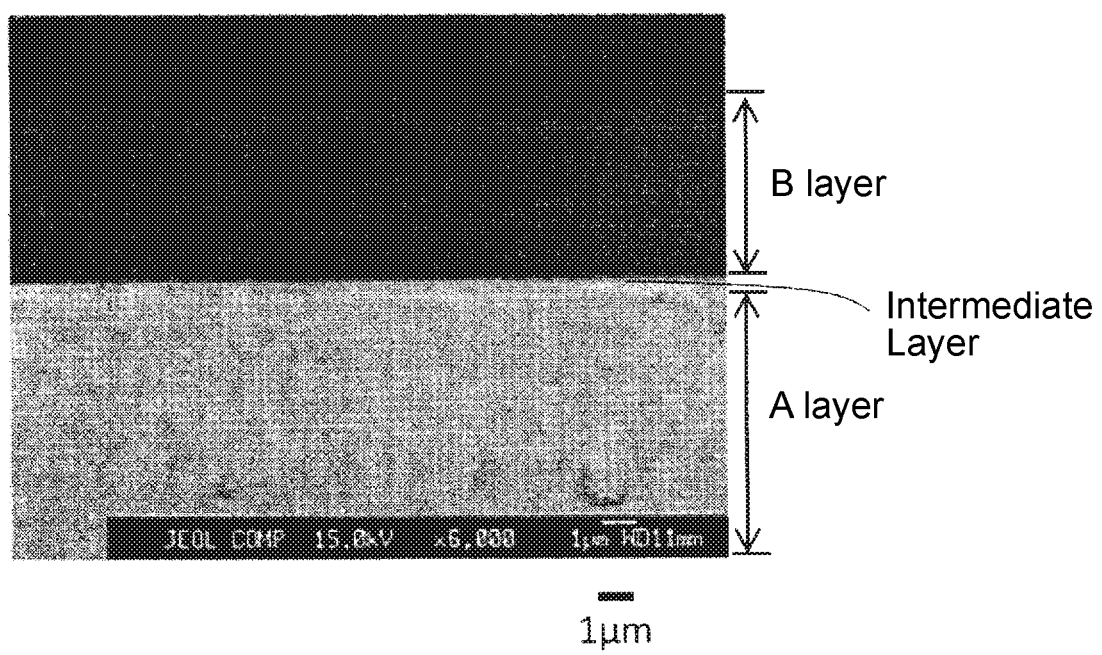
FIG. 2 is a magnified photograph showing the cross section of the coating in the example of the invention.
Figure 3:
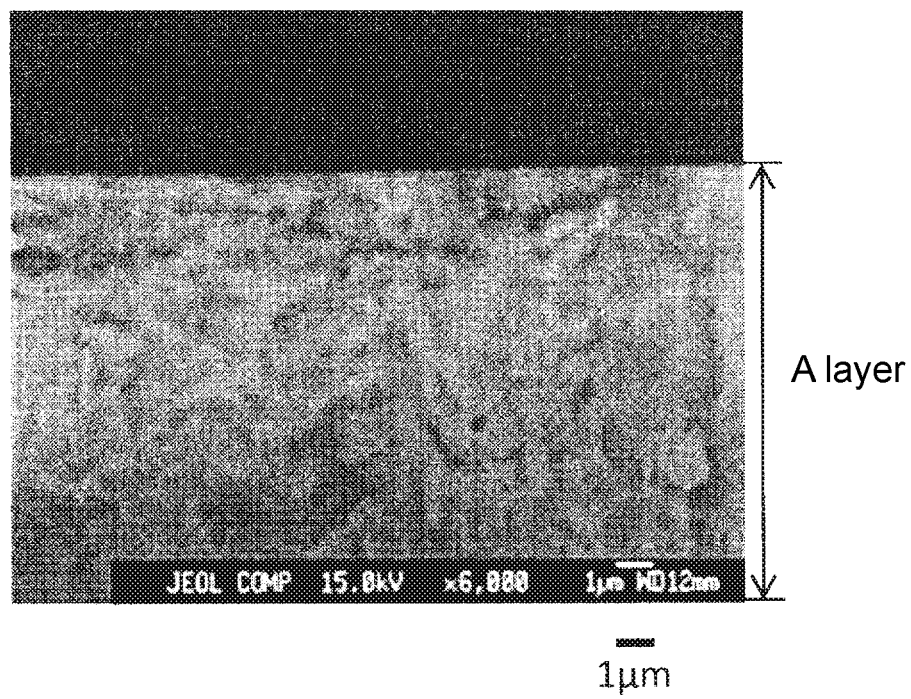
FIG. 3 is a magnified photograph showing the cross section of the coating in the comparative example.

Regarding all the Samples No. 14, No. 15, and No. 16, CrN was coated as the A layer, and coating of the B layer was not conducted. Regarding Sample No. 14, for the surface polishing of the A layer, polishing using AERO LAP and polishing using diamond paste of 1 μm were carried out. Regarding Sample No. 15, for the surface polishing of the A layer, only polishing using AERO LAP was carried out. Regarding Sample No. 16, surface polishing of the A layer was not carried out. The coating conditions for each sample are shown in Table 1. Further, in FIG. 2, a magnified photograph of the cross section of the coating in Sample No. 2, which is an example of the invention, is shown. In FIG. 3, a magnified photograph of the cross section of the coating in Sample No. 14, which is a comparative example, is shown.

TABLE 1

| Example No | A layer Composition | Film Thickness of A Layer | A layer Polishing | B layer Composition | Note |
|---|---|---|---|---|---|
| 1 | CrN | 6 μm | AERO LAP + Polishing | DLC | Example of the invention |
| 2 | AlCrSiN/VN | 6 μm | AERO LAP + Polishing | DLC | Example of the invention |
| 3 | AlCrSiN/VN | 9 μm | AERO LAP + Polishing | DLC | Example of the invention |

TABLE 1-continued

| Example No | A layer Composition | Film Thickness of A Layer | A layer Polishing | B layer Composition | Note |
|---|---|---|---|---|---|
| 11 | CrN | 6 μm | only AERO LAP | DLC | Comparative Example |
| 12 | CrN | 6 μm | none | DLC | Comparative Example |
| 13 | AlCrSiN/VN | 6 μm | none | DLC | Comparative Example |
| 14 | CrN | 6 μm | AERO LAP + Polishing | none | Comparative Example |
| 15 | CrN | 6 μm | only AERO LAP | none | Comparative Example |
| 16 | CrN | 6 μm | none | none | Comparative Example |

With regard to these samples, measurement of the surface roughness of the hard coating, a scratch test, a heat resistance test, and a ball-on-disc test were carried out. Methods of the evaluation tests are described below.

(Measurement of Surface Roughness)

For the measurement of surface roughness, a contact probe profilometer (SURFCOM) manufactured by TOKYO SEIMITSU CO., LTD. was used. The measurement conditions were as follows. Namely, evaluation length: 4 mm, measurement velocity: 0.3 mm/s, cut off value: 0.8 mm, and the kind of filter: Gaussian. The measurement results are shown in Table 2. Samples No. 1 to No. 3, which are the examples of the invention, all show the values that satisfy: $Ra \leq 0.2$ μm, $Rz \leq 2.0$ μm, and $Rsk < 0$, and it is understood that the surface is smooth and has a few convex portions. In Samples No. 11 and No. 15, which are comparative examples and in which the surface of the A layer was finished only by AERO LAP polishing, the skewness represents $Rsk > 0$, which does not satisfy the aimed surface roughness. Also in other comparative samples in which polishing of the surface of the A layer was not carried out, the surface roughness represents $Rz > 2.0$ μm and $Rsk > 0$, thus the samples do not have the intended surface roughness. Further, in No. 14, the B layer was not formed, so that the surface roughness shown in Table 2 is the surface roughness of the A layer. This A layer has a surface roughness of $Ra \leq 0.2$ μm, $Rz \leq 2.0$ μm, and $Rsk < 0$. In No. 14, polishing of A layer was carried out in the same manner as that in No. 1 to No. 3. Namely, it is understood that, in No. 1 to No. 3, the surface roughness of the A layer also satisfies $Ra \leq 0.2$ μm, $Rz \leq 2.0$ μm, and $Rsk < 0$.

(Scratch Test)

Subsequently, in order to evaluate the adhesion of the coating film, the peel load of the coating film was measured using a scratch tester (REVETEST) manufactured by CSM Instruments, Inc.

The measurement conditions were as follows. Namely, measuring load: from 0.9 N to 120 N, load speed: 99.25 N/min, scratch speed: 10 mm/min, scratch distance: 12 mm, AE sensitivity: 5, indenter: ROCKWELL, diamond, tip radius: 200 μm, hardware setting: Fn contact 0.9 N, Fn speed: 5 N/s, Fn removal speed: 10 N/s, and approach speed: 2%/s. The peeling critical load value of the coating film is taken as the load value at which the frictional force obtained by the measurement has fluctuated or the load at the time when the entire hard coating is peeled off from the metal mold. The measurement results are shown in Table 2 and FIG. 1.

As seen from Table 2 and FIG. 1, in all samples, a high adhesion with the critical peel load value of 90 N or higher is obtained. This is because the coating film is extremely thick and is as thick as 5 μm or more. Above all, in Sample No. 3, which is an example of the invention and in which the film thickness of the A layer is 9 μm, being thicker than other samples, peeling did not occur even at a measuring load of 120 N.

(Heat Resistance Test)

Figure 4:
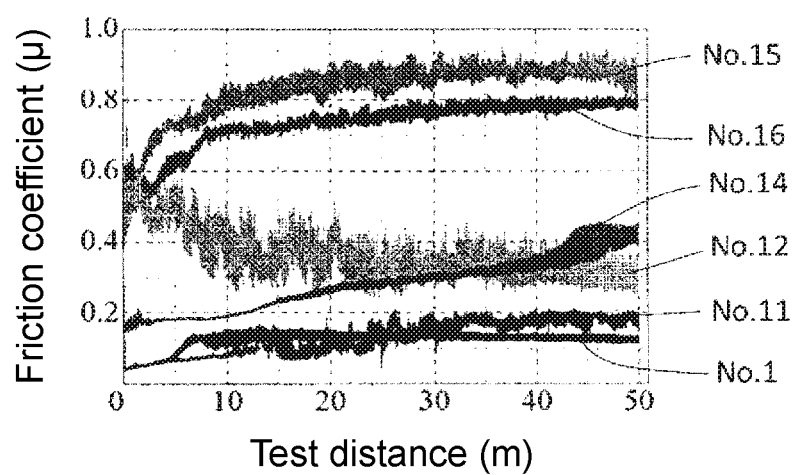
FIG. 4 shows the results of a ball-on-disk test in the examples of the invention and the comparative examples, when the opposite material is Zn.

Concerning the heat resistance test, in order to evaluate the oxidation resistance of the coating film, heat resistance of the coating film was evaluated as follows. Namely, each sample was heated in a constant temperature control type atmosphere furnace at 400° C.×1 hour. Then, by observation of the cross section of the coating film, whether reduction in film thickness has occurred or whether an oxidation layer is formed or not was evaluated. For example, in the case of a DLC coating constituted of C (carbon), or the like, the C in the coating film produces $CO_2$ gas when oxidized and, as a result, reduction in film thickness occurs. In the case of a nitride film, when oxidation proceeds, nitrides are replaced by oxides and, as a result, a low density oxide film is formed. The results are shown in Table 2 and FIG. 4. In all samples, after heating in an atmosphere furnace, neither reduction in film thickness nor formation of an oxidation layer had occurred, and thus, it was confirmed that there is no problem in heat resistance.

TABLE 2

| Example No | Surface Roughness | | | Scratch Test (N) *Peeling critical load value | Heat Resistance Test *Film thickness reduction *Oxidation layer formation | Note |
|---|---|---|---|---|---|---|
| | Ra(μm) | Rz(μm) | Rsk | | | |
| 1 | 0.015 | 0.173 | −1.449 | 95 | none | Example of the invention |
| 2 | 0.048 | 0.551 | −3.522 | 104 | none | Example of the invention |

TABLE 2-continued

| Example No | Surface Roughness Ra(μm) | Surface Roughness Rz(μm) | Surface Roughness Rsk | Scratch Test (N) *Peeling critical load value | Heat Resistance Test *Film thickness reduction *Oxidation layer formation | Note |
|---|---|---|---|---|---|---|
| 3 | 0.042 | 0.778 | -4.290 | more than 120 | none | Example of the invention |
| 11 | 0.053 | 0.988 | 1.371 | 97 | none | Comparative Example |
| 12 | 0.175 | 2.595 | 3.567 | 100 | none | Comparative Example |
| 13 | 0.373 | 3.959 | 2.529 | 109 | none | Comparative Example |
| 14 | 0.020 | 0.458 | -2.985 | 93 | none | Comparative Example |
| 15 | 0.031 | 0.808 | 4.455 | 98 | none | Comparative Example |
| 16 | 0.088 | 2.280 | 5.210 | 103 | none | Comparative Example |

(Ball-On-Disk Test)

Figure 5:
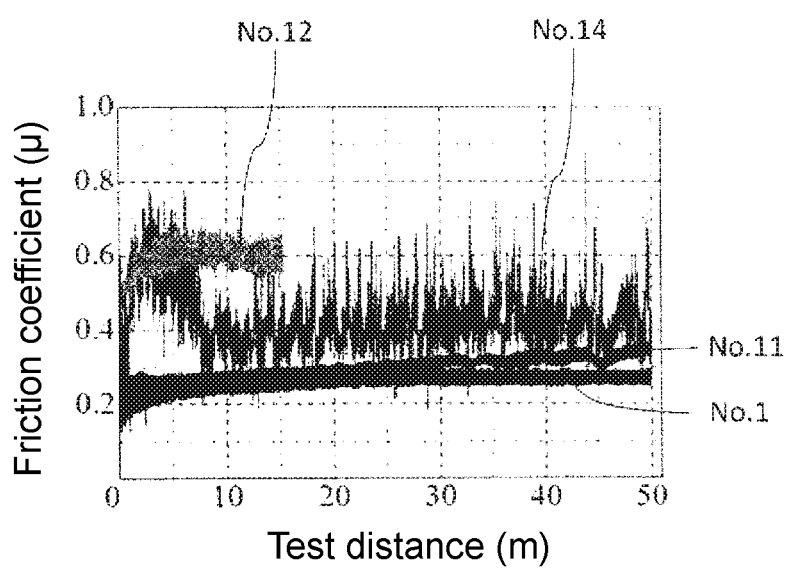
FIG. 5 shows the results of a ball-on-disk test in the examples of the invention and the comparative examples, when the opposite material is Al.

With regard to each sample, the sliding characteristic when the opposite material was Zn or Al was evaluated. As for the test conditions, a ball-on-disk tester (TRIBOMETER, manufactured by CSM Instruments, Inc.) was used. At 25° C. (ordinary temperature), while pressing an Zn pin having a tip diameter of ϕ6 mm or an Al ball of ϕ6 mm, as the opposite material, against the coating film with a load of 10 N, a disk-shaped test piece was rotated at a velocity of 10 cm/sec. The test distance was 50 m, and the friction coefficient was obtained by taking an average by the whole test distance. In Table 3, FIG. 4, and FIG. 5, the friction coefficients of each coating film at a plurality of the opposite materials are shown. Further, FIG. 6 shows the photograph of the appearance of the sliding portion.

In Samples No. 1 to No. 3, which are examples of the invention, in the case in which the opposite material was Zn and also in the case in which the opposite material was Al, adhesion to the sliding surface was not recognized. Further, regarding the friction coefficient, the samples showed a small value, such that, with respect to Zn, the friction coefficient was 0.15 or less, and with respect to Al, the friction coefficient was 0.25 or less. Namely, the samples had a stable frictional behavior. In contrast, in Samples No. 11 to No. 13, which are comparative examples and whose surface roughness is rough, in the case in which the opposite material was Zn and also in the case in which the opposite material was Al, adhesion was increased, and also the friction coefficient got larger. In the Samples No, 14 to No. 16, which are comparative examples and in which the B layer was not coated, the opposite material had adhered to the sample, regardless of the surface roughness.

TABLE 3

| Example No | Ball-on-Disk Test * Adhesion of Opposite material | | Ball-on-Disk Test *Average friction coefficient | | Overall judgment | Note |
|---|---|---|---|---|---|---|
| | Opposite material: Zn | Opposite material: Al | Opposite material: Zn | Opposite material: Al | | |
| 1 | none | none | 0.12 | 0.25 | ○ | Example of the invention |
| 2 | none | none | 0.12 | 0.26 | ○ | Example of the invention |
| 3 | none | none | 0.13 | 0.23 | ○ | Example of the invention |
| 11 | | 1.371 | 0.18 | 0.30 | X | Comparative Example |
| 12 | | 3.567 | 0.36 | 0.59 | X | Comparative Example |
| 13 | | 2.529 | 0.34 | 0.62 | X | Comparative Example |
| 14 | | -2.985 | 0.34 | 0.43 | X | Comparative Example |
| 15 | | 4.455 | 0.82 | 0.64 | X | Comparative Example |
| 16 | | 5.210 | 0.74 | 0.81 | X | Comparative Example |

What is claimed is:

1. A coated metal mold for warm/hot working comprising: a metal mold, and
a hard coating disposed on a surface of the metal mold, the hard coating comprising an A layer formed from a nitride and having a film thickness of 5 μm or more, a B layer formed from a diamond-like carbon coating and having a film thickness in a range of from 2 μm to 15

µm, and, between the A layer and the B layer, a coating film having a composition different from that of the A layer, wherein:

the A layer is a laminated film comprising alternating layers of (a) a layer comprising a nitride containing chromium and (b) a layer comprising a nitride containing vanadium;

the coating film contains titanium carbide; and the A layer is disposed between the metal mold and the B layer, and a surface of the B layer has an arithmetic mean roughness Ra≤0.2 µm, a maximum height Rz≤2.0 µm, and a skewness Rsk<0, and wherein, in the B layer, a content percentage (atomic %) of hydrogen is in a range of from 5% to 30% and a content percentage (atomic %) of nitrogen is in a range of from 5% to 20%, wherein the metal mold material being coated with the hard coating is hot die steel, or high-speed steel.

2. The coated metal mold according to claim 1, wherein the film thickness of the A layer in a range of from 8 µm to 70 µm.

3. A method for manufacturing a coated metal mold having a hard coating on a surface thereof, wherein the method comprises:

applying an A layer formed from a nitride and having a film thickness of 5 µm or more using an arc ion plating method, polishing a surface of the A layer so that the A layer has a surface roughness Ra≤0.2 µm, a maximum height Rz≤2.0 µm, and a skewness Rsk<0, after polishing the surface of the A layer, applying a coating film having a composition different from that of the A layer wherein the coating film contains titanium carbide, and after applying the coating film, applying a B layer formed from a diamond-like carbon coating, wherein a surface of the B layer has an arithmetic mean roughness Ra≤0.2 µm, a maximum height Rz≤2.0 µm, and a skewness Rsk<0, and wherein, in the B layer, a content percentage (atomic %) of hydrogen is in a range of from 5% to 30% and a content percentage (atomic %) of nitrogen is in a range of from 5% to 20%.

4. The method for manufacturing the coated metal mold according to claim 3, wherein the film thickness of the A layer in a range of from 8 µm to 70 µm.

* * * * *